(12) United States Patent
Petruzzi et al.

(10) Patent No.: US 8,946,943 B2
(45) Date of Patent: Feb. 3, 2015

(54) HIGH SIDE SWITCH

(75) Inventors: Luca Petruzzi, Goedersdorf (AT);
Alberto Zanardi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 702 days.

(21) Appl. No.: 13/191,754

(22) Filed: Jul. 27, 2011

(65) Prior Publication Data

US 2013/0027114 A1    Jan. 31, 2013

(51) Int. Cl.
*H01H 19/64* (2006.01)
*H03K 17/18* (2006.01)
*H03K 17/082* (2006.01)
*H01L 25/16* (2006.01)

(52) U.S. Cl.
CPC .......... *H03K 17/18* (2013.01); *H03K 17/0822* (2013.01); *H03K 2217/0063* (2013.01); *H01L 25/16* (2013.01)
USPC ........................................ 307/113

(58) Field of Classification Search
USPC ........................................ 307/113
See application file for complete search history.

(56) References Cited

U.S. PATENT DOCUMENTS

| 6,414,404 | B1 * | 7/2002 | Allen | 307/130 |
| 6,438,462 | B1 * | 8/2002 | Hanf et al. | 700/297 |
| 6,717,828 | B2 | 4/2004 | Iwagami et al. | |
| 6,778,001 | B2 | 8/2004 | Mayama et al. | |
| 2003/0002234 | A1 * | 1/2003 | Evans et al. | 361/64 |
| 2005/0135037 | A1 * | 6/2005 | Thiery et al. | 361/94 |
| 2013/0300544 | A1 * | 11/2013 | Kamel | 340/10.5 |

FOREIGN PATENT DOCUMENTS

JP    2003309982 A    10/2003

OTHER PUBLICATIONS

International Standard ISO 7637-2, "Road vehicles—Electical disturbances from conduction and coupling—Part 2: Electrical transient conduction along supply lines only," $2^{nd}$ edition, Jun. 15, 2004, 42 pages.
SPOC—BTS5682E, "SPI Power Controller," Infineon Data Sheet, Rev. 1.0, Jan. 2008, 46 pages.
SPOC—BTS5460SF, "SPI Power Controller for Advanced Front Light Control," Infineon Data Sheet Rev. 1.0, Apr. 12, 2010, 58 pages.

* cited by examiner

*Primary Examiner* — Jared Fureman
*Assistant Examiner* — Duc M Pham
(74) *Attorney, Agent, or Firm* — Slater & Matsil, L.L.P.

(57) ABSTRACT

A semiconductor chip includes at least one power semiconductor switch configured to activate and deactivate current conduction from a first supply terminal, which is connected to a first supply line that provides an unstabilized first supply voltage, to the at least one output terminal in accordance with a respective control signal. In operation, the unstabilized first supply voltage is monitored and an under-voltage is signaled when the unstabilized first supply voltage falls below a first threshold value. The first supply terminal is short circuited with a third terminal when the an under-voltage is signaled.

13 Claims, 3 Drawing Sheets

HIGH SIDE SWITCH

TECHNICAL FIELD

The invention generally relates to the field of semiconductor devices, and in particular embodiments, to switches such as "smart semiconductor switches."

BACKGROUND

"Smart semiconductor switches" often include, besides the semiconductor switch, driver circuitry for driving the semiconductor switch on and off in a defined manner as well as interface circuitry for allowing communication with external components such as micro controllers, which control the operation of the smart switch at a higher abstraction level. One example of such a smart switch is Infineon's four channel high-side smart power switch BTS5682E (see BTS5682E, Data Sheet, Rev. 1.0, 2008-01-22) which may typically be employed in automotive light control applications.

In many applications smart power switches have to be designed to withstand transient electrical disturbances due to inductive or capacitive coupling as well as electrostatic discharges (ESD). For example, smart power switches have to be tested in accordance with the ISO 7637-2 standard. Such "transient immunity tests" are performed to check whether the device under test is able to withstand certain transient disturbances which may occur at the input or output pins. ISO 7637-2 defines some standard pulses which represent realistic disturbances that may occur in automotive applications.

As every smart switch has to fulfill some requirements with respect to susceptibility to transient disturbances, there is generally a need to provide smart power switches with efficient protection circuitry which guarantee a high immunity to relevant transient disturbances.

SUMMARY OF THE INVENTION

A semiconductor chip such as a smart switch is disclosed. In accordance with one example of the invention the chip includes a first supply terminal operably connected to a first supply line providing an unstabilized first supply voltage. A second supply terminal is operably connected to a second supply line providing a stabilized second supply voltage. A third terminal provides a reference potential. At least one output terminal provides an output current. At least one power semiconductor switch is integrated in the semiconductor chip and configured to activate and deactivate current conduction from the first supply terminal to the at least one output terminal in accordance with a respective control signal. Control circuitry for providing the control signal is supplied to the at least one power semiconductor switch. The control circuitry includes a monitoring circuit supplied by the stabilized second supply voltage and configured to monitor the unstabilized first supply voltage. The unstabilized first supply voltage including signaling an under-voltage when the unstabilized first supply voltage falls below a first threshold value is monitored. The control circuitry includes a switch configured to short circuit the first supply terminal and the third terminal when the monitoring circuit signals an under-voltage. Further a method for operating a semiconductor chip is disclosed. The semiconductor chip includes at least one power semiconductor switch configured to activate and deactivate current conduction from a first supply terminal. The first supply terminal is connected to a first supply line providing an unstabilized first supply voltage to the at least one output terminal in accordance with a respective control signal. The method includes monitoring the unstabilized first supply voltage and signaling an under-voltage when the unstabilized first supply voltage falls below a first threshold value. The first supply terminal and a third terminal are short-circuited which provides a reference potential, when the an under-voltage is signaled.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts.

DETAILED DESCRIPTION OF ILLUSTRATIVE EMBODIMENTS

Figure 1:
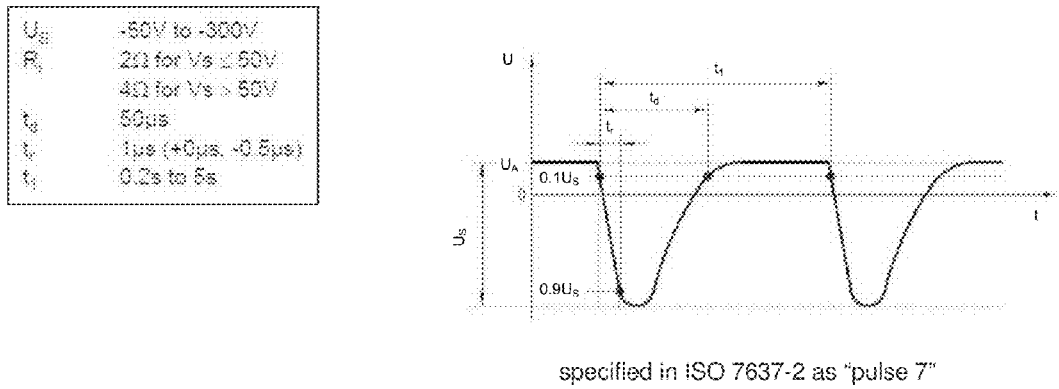
FIG. 1 illustrates the waveform of pulse number 7 as defined in the ISO 7637-2 standard representing a negative voltage swing at a supply line due to electromagnetic interferences.

As mentioned above, products designed for usage in automotive applications usually have to be tested in accordance with the ISO 7637-2 standard. Within this standard, pulse number 7 (named as "ISO7 pulse" from now on) is of special interest as providing sufficient protection against such pulses in "SMART switches" may be a challenging task. Smart switches are usually multi-channel high-side switches with an integrated digital circuitry controlled by a digital interface such as, for example, the SPI (serial peripheral interface). An important class of smart switches is realized using an n-substrate technology. An ISO7 pulse represents the transient disturbance occurring on the supply line when electrical motors (for instance, the motor driving the wiper) are connected to the same supply line. As illustrated in FIG. 1, during this pulse the supply potential $U_A$ (e.g., $U_A$=13.5V in 12V systems) provided by the battery on the supply line drops from the positive value $U_A$ (e.g., 13.5V) to negative values (ranging from approximately −50V to down to −300V) within approximately one microsecond $t_r$=1 μs). The supply potential recovers to $U_A$ after approximately $t_d$=50 μs. These pulses may repeatedly occur after a time t1 wherein t1 may range from approximately 0.2 s to 5 s.

However, it should be noticed that the values for $t_r$, $t_d$, and $t_1$ as well as the magnitude of the negative voltage swing (see voltage swing $U_S$ in FIG. 1) may vary dependent on the actual application and the capacitive load coupled to the respective supply line. The higher this capacitance, the smaller will be the resulting negative voltage swing $U_S$. A capacitive load in the range of, for example, 5 to 10 μF is usually sufficient to ensure that the potential of the respective supply line does not drop to negative values. Although such high capacitance values are considered "good practice", for some years automotive module manufacturers have tended to decrease the value of such capacitance in order to limit costs. As a consequence, negative voltages may occur on the supply lines and electronic devices connected to the affected supply lines, such as smart switches, have to cope with such disturbances without exhibiting any malfunction. Test smart switches have to be immune against the ISO7 pulse used in standardized tests as discussed above.

Figure 2:
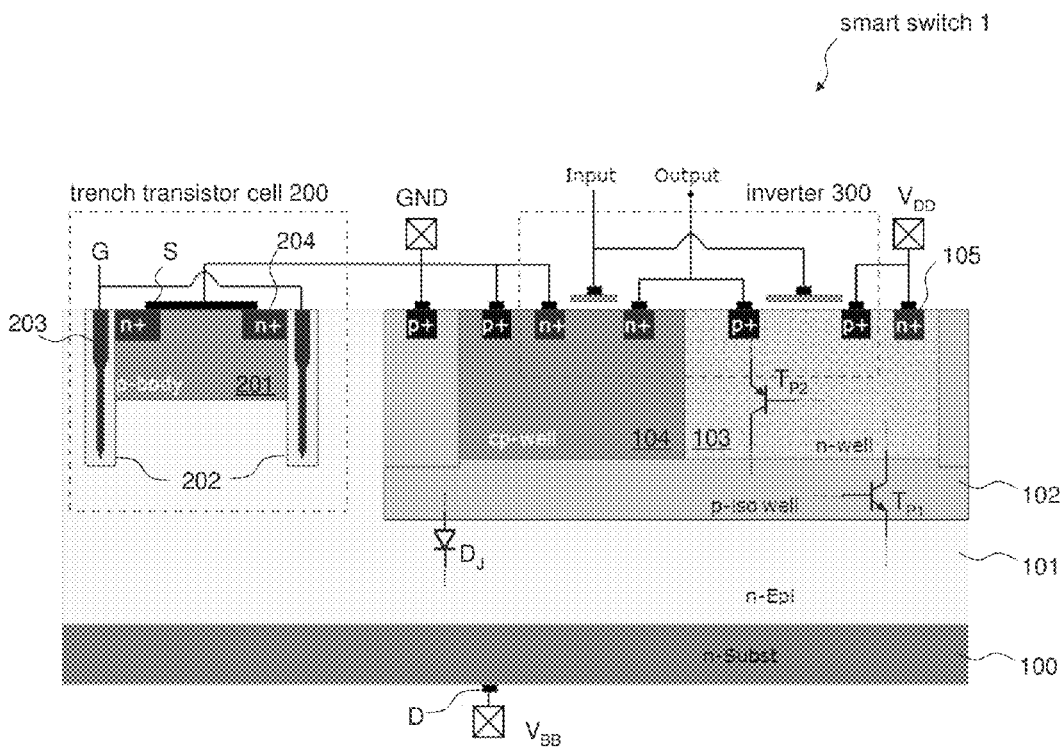
FIG. 2 illustrates, in an exemplary manner, a schematic cross section through a part of a semiconductor body forming, e.g., a smart switch.

FIG. 2 illustrates (in parts) one basic exemplary implementation of a smart switch 1 integrated in an n-substrate. The purpose of that illustration is to pinpoint some adverse effects of an ISO7 pulse on the smart switch and its function. FIG. 2 illustrates the typical set-up of a vertical n-channel power MOSFET. That is, an n-doped epitaxial layer 101 is formed on an n-doped semiconductor substrate 100. One transistor cell 200 of a power MOSFET is formed by a p-doped body region 201 arranged in the epitaxial layer 101 between two trenches 202 in which gate electrodes 203 are provided (typically by filling the trenches with polycrystalline silicon). Adjoining to the top surface of the body region 201 and to the sidewalls of the trenches 202, $n^+$-doped source regions 204 are formed which are connected to a source electrode S. The drain electrode D is connected to the n-substrate 100 at the bottom surface.

Besides the vertical power MOSFET 200 an inverter 300 (which may form a part of a logic circuitry) may be integrated in the semiconductor body including n-doped substrate 100 and n-doped epitaxial layer 101. The inverter 300 is separated from the power transistor 200 by a p-doped isolation well 102 which is grounded (chip pin labeled GND) during operation so that the diode formed at the junction between the isolation well 102 and the epitaxial layer 101 is reverse biased. An n-doped well 103 and a corresponding p-doped well 104 (labeled "cp-well" which is short for "CMOS p-well") is enclosed by the top surface of the epitaxial layer 101 and the isolation well 102. The n- and p-doped wells 103 and 104, respectively, form the body regions of corresponding p-channel and n-channel low power MOS transistors which are electrically connected to form an CMOS inverter circuit 300, wherein the source region ($n^+$-doped) of the n-channel MOS transistor is connected to ground GND, the drain region ($n^+$-doped) of the n-channel MOS transistor and the drain region ($p^+$-doped) of the p-channel MOS transistor are connected to the inverter output and the source region ($p^+$-doped) of the p-channel MOS transistor is connected to a chip pin $V_{DD}$ providing a corresponding positive supply potential (which is not to be confused by the battery supply potential present on the supply line from the battery plied to the chip pin $V_{BB}$).

Figure 3:
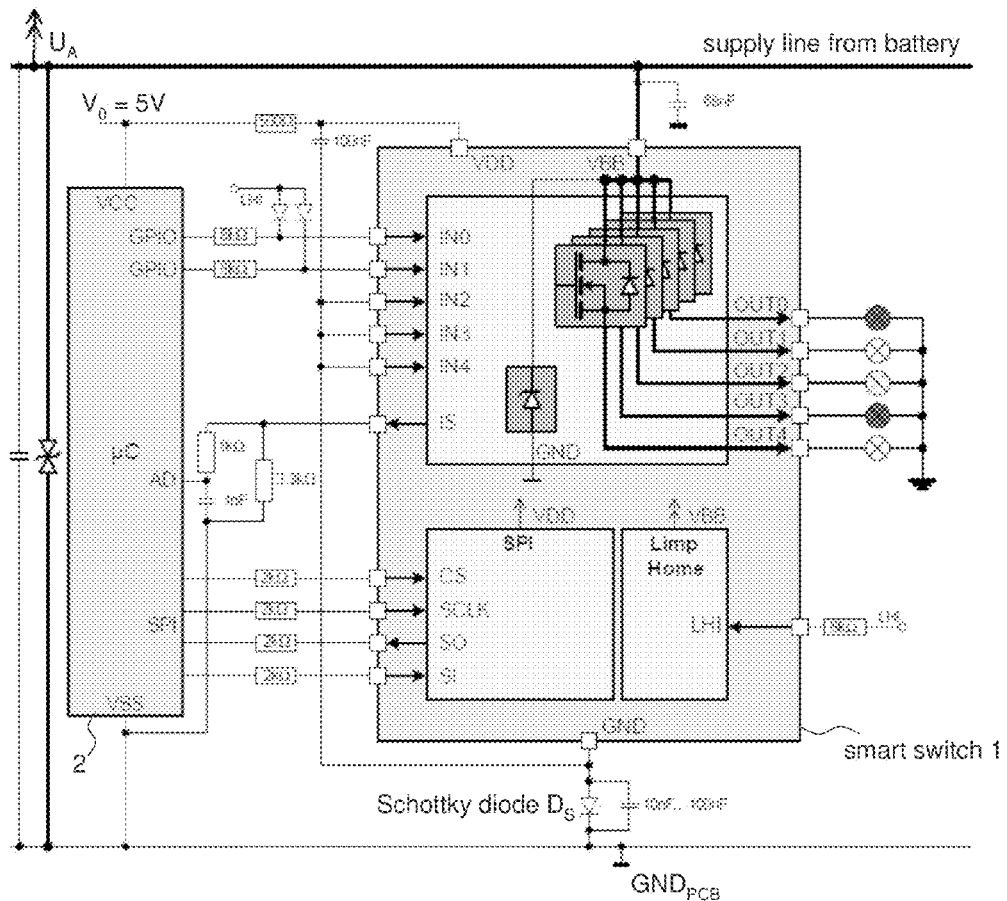
FIG. 3 illustrates, in an exemplary manner, a block diagram including some parts of a smart switch.

FIG. 3 illustrates, as a block diagram, an electronic module including the smart power switch 1 of FIG. 2 and a micro controller 2 which is configured (e.g., using an appropriate software) to control the operation of the smart power switch 1. The smart power switch may actually include more than one (in the present case five) output channels, wherein each output channel provides a current path from the battery supply pin $V_{BB}$ to the respective output pin $OUT_0$ to $OUT_4$. Each current path can be activated and deactivated by switching on and off the respective power MOS transistor 200 (see FIG. 2).

In the simplified example of FIG. 2 all the control, driver and interface circuitry included in the smart power switch 1 is represented by the inverter 300. In the example of FIG. 3 the smart power switch includes besides the power transistors 200 and amongst other components an SPI interface for communicating with the micro controller 2 over the SPI bus. In accordance with the SPI standard four pins (serial data in SI, serial data out SO, chip select CS, and serial clock SCLK) and corresponding lines are required which connect the SPI interface of the smart power switch 1 and the corresponding SPI interface of the micro controller 2. As the SPI is commonly used in connection with micro controllers the details about the SPI bus are not discussed here. It should be emphasized here, that any other serial bus can be used instead (e.g., the $I^2C$ bus or the like) without major modifications to the present example.

The electronic module illustrated in FIG. 3 usually includes a printed circuit board (PCB, not shown) to which the smart power switch 1 and the micro controller 2 are attached to amongst other components. The ground pin GND of the smart power switch 1 and the ground terminal $GND_{PCB}$ of the module are coupled via a Schottky diode $D_S$ which is usually provided in order to protect the module against reverse polarity. As can be seen from FIG. 3 resistors of, e.g., 2 kΩ can be provided in series to the SPI bus lines connecting the SPI interface (SI, SO, SCLK, CS) of the smart power switch to the corresponding interface of the micro controller 2. It should be noted that many commonly used micro controllers are provided with integrated SPI interfaces. Unlike the smart power switch, the micro controller 2 does not require a Schottky diode for protection against reverse polarity of the supply voltage, as the micro controller 2 supplied from a voltage regulator (e.g., 5V regulator) which typically includes a sufficient reverse polarity protection.

The input ports IN0 to IN4 (short INx, x=0, 1, . . . , 4) provide an alternative way to activate or deactivate the respective power semiconductor switches coupled to the corresponding outputs OUT0 to OUT4 (short OUTx, x=0, 1, . . . , 4). If an input port INx is driven with a high voltage level (e.g., 5V) then the respective output OUTx is activated by switching on the corresponding power semiconductor switch. Conversely, a low level (e.g., 0V) may switch off the respective power semiconductor switch. Alternatively, the switches are activated or deactivated using appropriate SPI commands received via the serial SPI interface.

In the example depicted in FIGS. 2 and 3 (smart switch integrated using an n-substrate technology) a negative potential $V_{BB}$ at a circuit node connected to the drain D of the power MOS transistor has mainly three effects:

1) The normally reverse biased diode (see diode $D_J$ in FIG. 2) between GND and $V_{BB}$ (cathode) becomes forward biased which makes the potential of the isolation well 102 "follow" the negative potential of the supply line pin $V_{BB}$ with a difference of 0.7 V (which corresponds to the voltage drop across the diode $D_J$). This is possible as the Schottky diode $D_S$ (see FIG. 3) connected externally between the ground pin GND of the smart power switch 1 and the actual ground potential $GND_{PCB}$ of the PCB becomes reversed biased, allowing potential of the ground pin GND of the smart power switch to follow the potential of the supply line pin $V_{BB}$ the without restriction, thus generating a "ground shift" in the smart power switch.

2) The parasitic npn-transistor (see transistor $T_{P1}$ in FIG. 2) connected between the $V_{DD}$ pin (collector, n-well 103), the GND pin (base, isolation p-well 104), and the $V_{BB}$ pin (emitter, n-substrate 100) of the smart switch will become active, pulling current from the supply line (providing $V_0$=5V) at the $V_{DD}$ pin of the smart switch. The amount of this current will be limited by a series circuit of the following resistors: n-well 103 resistance, internal ESD resistance (50Ω), and the external resistance on the VDD line (500Ω). If the transistor current is high enough, the resulting voltage drop (i.e., the parasitic transistor's collector-emitter-voltage) between the pin $V_{DD}$ and the internal circuitry will be enough to trigger an "undervoltage reset" of the logic, clearing all settings. This effect is explained later with respect to FIG. 4.

3) Due to effect 2) discussed above a voltage drop $V_X$ may occur between the pin $V_{DD}$ (directly connected to the body contact region 105) and the p-doped isolation well 102. This voltage drop $V_X$ may activate a parasitic pnp-transistors $T_{P2}$ connected between the inverter output and ground GND (via isolation well 102). Thereby the p+-doped drain region of the p-channel MOS transistor forms the emitter, the n-well 103 the base, and the p-doped isolation well the collector of the parasitic transistor $T_{P2}$. The activation of the parasitic pnp-transistor triggers the discharging of internal circuit nodes thus bringing the logic into "unwanted" states (e.g., if the inverter output node is a "1", i.e., at 5V, the potential could go to 0V during this discharging. Thus downstream circuits receiving the inverter output as input may "see" as a "0" instead of a "1".

The "ground shift" (effect 1 as discussed above) will have 3 consequences:

a) a "low" voltage level (e.g., a logic "0" or 0V) provided at an I/O pin of the micro controller 2 may be "seen" as a "high" voltage level (e.g., a logic "1") by the smart switch 1 when the ground shift is around −2V.

b) for the same reason, the internal logic circuit (i.e., the input buffer circuits, responsible for the detection of high or low logic levels at the external pins) may "see" a rising edge at the CS and SCLK pins of the SPI interface of the smart switch 1. This is critical because the corresponding chip select (CS) and serial clock (SCLK) signals are used as clock lines for the internal logic. Generally, a good digital design practice is to not have two clock signals moving together in phase as this could generate metastability and incorrect clock pulses which would adversely affect the behavior of the internal logic circuitry (i.e., the SPI interface including the required shift registers and (modulo 8 bit) counter).

c) In smart switches LHI pin (LHI: short for "limp home input") is used as an external reset pin of the internal logic circuits. The external reset pin may be driven by an external controller device such as, e.g., a micro controller or an SBC (short for "System Basis Chip"). In case of a fault at the level of the electronic module (i.e., outside of the smart switch 1) the smart switch may "see" an unintentional reset at the LHI pin resulting from the ground shift thus triggering an undesired reset. In case of a micro controller, a dedicated chip mounted in the module (e.g., an SBC, System Basis Chip) issues a "Limp Home" signal to activate a limited number of safety functions. For example, if the LHI input port is at a high logic level, the SPI interface enters a predefined state (e.g., a reset state) and does not react anymore to incoming SPI commands, but the high side semiconductor switches can still be activated/deactivated applying appropriate signals at the corresponding INx ports.

Figure 4:
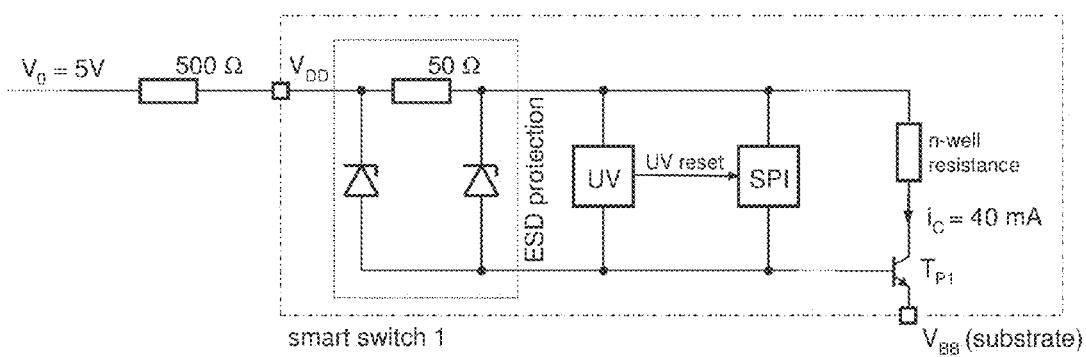
FIG. 4 illustrates some details of the smart switch of FIG. 3 not shown in FIG. 3.

Another effect is illustrated in FIG. 4. In case of an activation of the parasitic transistors $T_{P1}$ and $T_{P2}$ (see FIG. 2) the current drawn from supply pin $V_{DD}$ (e.g., 40 mA) will cause a voltage drop of 2V across the 50 Ohm ESD protection resistor coupled in series to the supply line in the interior of the smart switch. This voltage drop is enough (even if the potential at the $V_{DD}$ pin would constantly remain 5V) to cause the under-voltage reset circuitry (labeled UVR) to trigger a master reset signal resetting the SPI interface.

In summary, an ISO7 pulse can cause quite a turmoil in a smart switch and thus compromise the reliability of the electronic module as a whole. To alleviate the above mentioned problems at lease one of the countermeasures explained below with respect to FIG. 5 may be employed.

Figure 5:
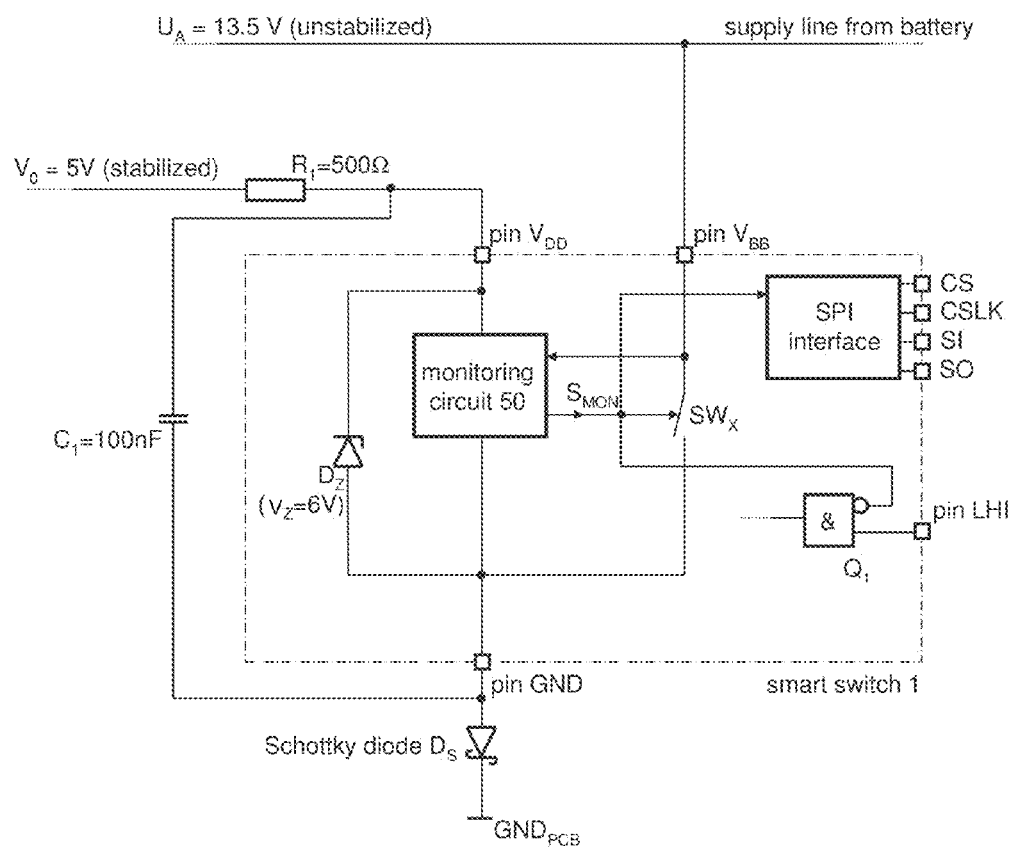
FIG. 5 illustrates in a block diagram some circuit components used for protecting the smart switch against the negative effects of ISO7 pulses.

FIG. 5 illustrates, as a first example of the invention, some important features that may help alleviate problems discussed above resulting from an ISO7 pulse. The example of FIG. 5 illustrates a block diagram of a semiconductor chip such as, for example, a smart power switch 1 as discussed above. The semiconductor chip includes a first supply terminal, i.e., pin $V_{BB}$, connected to a first supply line that provides an unstabilized supply voltage $U_A$ such as, for example $U_A$=13.5V as generated by an automotive battery. The chip further comprises a second supply terminal, i.e., pin $V_{DD}$, connected to a second supply line providing a stabilized second supply voltage $V_0$ such as, $V_0$=5V as usually required for the operation of micro-controllers and logic circuits. A third terminal, i.e., pin GND, provides a reference potential, usually the ground potential for the chip. At least one power semiconductor (not shown in FIG. 5, see FIG. 3) switch is integrated in the semiconductor chip and configured to activate and deactivate current conduction from pin $V_{BB}$ to a corresponding output terminal (see FIG. 3) in accordance with a respective control signal. The chip comprises control circuitry for providing the control signal supplied to the at least one power semiconductor switch. The control circuitry includes a monitoring circuit 50 supplied by the stabilized supply voltage $V_0$ and configured to monitor the unstabilized supply voltage $U_A$. The monitoring of the unstabilized supply voltage $U_A$ includes signaling an under-voltage when the unstabilized supply voltage $U_A$ falls below a first threshold value. A switch is configured to short-circuit pin $V_{BB}$ and the ping GND when the monitoring circuit signals an under-voltage.

Short-circuiting pin $V_{BB}$, which provides the supply voltage $U_A$, and the ground pin GND will prevent an activation of the parasitic transistors $T_{P1}$, $T_{P2}$ as explained above with respect to FIG. 3. In the example of FIG. 5, monitoring circuit 50 generates a signal $S_{MON}$ which is active then the supply voltage $U_A$ drops below the threshold mentioned above. Consequently, a switch $SW_X$ will short-circuit the two pins in response to an appropriate signal $S_{MON}$ and, as a result, the potential of pin GND will be equal to $U_A$. As the threshold is positive the potential at the ground pin GND will be equal to $U_A$ the short circuit is particularly active for negative values of the supply voltage $U_A$.

The monitoring circuit 50 is supplied by the stabilized supply voltage $V_0$ which is also used for supplying the micro-controller (see FIG. 3). As in case of an ISO7 pulse the potential at the ground pin may fall to negative values a zener diode (e.g., an ESD protection diode) may be connected between the pin $V_{DD}$ and the ground pin GND, wherein the respective zener voltage V $_Z$ of the zener diode is slightly higher than the stabilized supply voltage $V_0$. For example the zener voltage may be chosen $V_Z$=6V for $V_0$=5V, i.e., $V_Z$ may be up to 10% or 20% higher than $V_0$. Dependent in the internal resistance of the voltage source providing $V_0$ a resistor $R_1$ (e.g., R1=500Ω) may be provided in the supply line connected to pin $V_{DD}$. Further, a small capacitor $C_1$ (e.g., $C_1$=100 nF) may be provided between pins $V_{DD}$ and GND to absorb short transient voltage peaks. In case of an activated switch $SW_X$, the zener diode clamps the voltage present at pin $V_{DD}$ to a value of $U_A+V_Z$, that is about 6V above the potential present at the ground pin GND in the present example. For $U_A$=−15V (during an ISO7 pulse) the potential at the pin GND will be about −15 V, too, and the potential present at pin $V_{DD}$ will be about −9 V. Thus the control circuitry of the smart switch "sees" a supply voltage at the pin VDD of about $V_Z$=6V.

Usually, a diode may be connected between the ground pin GND of the smart power switch and the ground connector of the whole module. In the present case a Schottky diode $D_S$ is used. During normal operation the Schottky diode will cause only a small potential difference between ground pin GND of the chip and the ground connector $GND_{PCB}$ of the module. However, during supply voltage reversal and also during an ISO7 pulse the diode may be reverse biased and the potential present at the ground pin GND of the chip thus floating.

In accordance to a further example and also illustrated in FIG. 5 the control circuitry of the smart switch may include a gate circuit $Q_1$ configured to blank a reset signal when the monitoring circuit signals an under-voltage. The reset signal may be received via a respective reset pin LHI from an external controller (e.g., the system basis chip SBC mentioned above). In case of a negative ISO7 pulse at the supply pin $V_{BB}$, the potential at the ground pin GND node will follow the potential of the supply pin $V_{BB}$ (with our without short-circuiting the pins GND and $V_{BB}$). This implies that a logical "0" at the LHI pin will be interpreted as a logical "1" thus causing an SPI reset. To avoid such a reset even when the potential at the ground pin GND of the chip falls below the potential present at the module ground connector $GND_{PCB}$ the gate Q1 (and the signal $S_{MON}$) is employed to block the reset signal. Thus an external reset is avoided and the internal settings of the control circuitry are preserved (which might be deleted in case on an external reset).

In accordance to a further example and also illustrated in FIG. 5 the control circuitry further may comprise a bus interface for communication with at least one external electronic component. In particular, this bus interface may be a serial interface such as the SPI. The control circuit may receive (inter alia) control data from the micro-controller 2 across the SPI bus and transmit diagnostic and status data back to the micro-controller 2. The diagnostic data may include a tag (e.g., a single bit) that signals an under-voltage upon detection by the monitoring circuit 50. In that way, the micro-controller may be informed that an ISO7 pulse has been detected. The control circuit may be further configured to reject received command data (e.g., from the micro-controller) when an ISO7 pulse is detected. In case of an under-voltage the SPI is deactivated regardless of the potential present at the supply pin $V_{BB}$. The sender (e.g., the micro-controller 2) may then retransmit the command to the smart switch after the ISO7 pulse has decayed.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
   a first supply terminal operably connected to a first supply line that provides an unstabilized first supply voltage;
   a second supply terminal operably connected to a second supply line that provides a stabilized second supply voltage;
   a third terminal that provides a reference potential;
   at least one output terminal that provides an output current;
   at least one power semiconductor switch integrated in the semiconductor chip and configured to activate and deactivate current conduction from the first supply terminal to the at least one output terminal in accordance with a respective control signal; and
   control circuitry configured to provide the control signal supplied to the at least one power semiconductor switch, the control circuitry comprising;
   a monitoring circuit supplied by the stabilized second supply voltage and configured to monitor the unstabilized first supply voltage, the monitoring of the unstabilized first supply voltage comprising signaling an under-voltage when the unstabilized first supply voltage falls below a first threshold value, and
   a switch configured to short circuit the first supply terminal and the third terminal when the monitoring circuit signals the under-voltage.

2. The semiconductor chip of claim 1, further comprising a zener diode coupled between the second supply terminal and the third terminal, a zener voltage of the zener diode being higher than the stabilized second supply voltage.

3. The semiconductor chip of claim 2, further comprising:
   a fourth terminal operably configured to receive a reset signal;
   wherein the control circuitry further comprises a gate circuit configured to blank the reset signal when the monitoring circuit signals the under-voltage.

4. The semiconductor chip of claim 1, further comprising:
   a fourth terminal operably configured to receive a reset signal;
   wherein the control circuitry further comprises a gate circuit configured to blank the reset signal when the monitoring circuit signals the under-voltage.

5. The semiconductor chip of claim 1, wherein the control circuitry further comprises a bus interface for communication with at least one external electronic component.

6. The semiconductor chip of claim 5, wherein the control circuitry is configured to transmit diagnostic data via the bus interface to the at least one external electronic component, the diagnostic data including a tag signaling that the under-voltage has been detected.

7. The semiconductor chip of claim 5, wherein the control circuitry is configured to reject received command data when the under-voltage has been detected.

8. The semiconductor chip of claim 4, wherein the control circuitry is configured to reject received command data when the under-voltage has been detected.

9. An electronic module comprising:
   a printed circuit board (PCB) having a first connector operably connected to a first supply line that provides an unstabilized first supply voltage, and a second connector operably connected to a reference potential;
   a microcontroller attached to the PCB; and
   a semiconductor chip attached to the PCB;
   the semiconductor chip comprising:
      a first supply terminal coupled to the first connector to receive the unstabilized first supply voltage;
      a second supply terminal operably connected to a second supply line that provides a stabilized second supply voltage;
      a third terminal coupled to the second connector via a diode to receive the reference potential;
      at least one output terminal configured to provide an output current;
      at least one power semiconductor switch integrated in the semiconductor chip and configured to activate and deactivate current conduction from the first supply terminal to the at least one output terminal in accordance with a respective control signal; and control circuitry for providing the control signal supplied to the at least one power semiconductor switch, the control circuitry comprising;

a monitoring circuit supplied by the stabilized second supply voltage and configured to monitor the unstabilized first supply voltage, the monitoring of the unstabilized first supply voltage comprising signaling an under-voltage when the unstabilized first supply voltage falls below a first threshold value, and a switch configured to short circuit the first supply terminal and the third terminal when the monitoring circuit signals the under-voltage.

10. A method for operating a semiconductor chip that comprises at least one power semiconductor switch configured to activate and deactivate current conduction from a first supply terminal, which is connected to a first supply line that provides an unstabilized first supply voltage, to at least one output terminal in accordance with a respective control signal, the method comprising:

monitoring the unstabilized first supply voltage and signaling an under-voltage when the unstabilized first supply voltage falls below a first threshold value, and short-circuiting the first supply terminal and a third terminal, when the under-voltage is signaled, the third terminal providing a reference potential.

11. The method of claim 10, further comprising blanking a reset signal received by the semiconductor chip when the under-voltage is signaled.

12. The method of claim 10, further comprising transmitting diagnostic data via a bus interface integrated in the semiconductor chip to an external electronic component, the diagnostic data including a tag signaling that the under-voltage has been detected.

13. The method of claim 12, further comprising rejecting received command data by the bus interface when the under-voltage has been detected.

* * * * *